United States Patent [19]

Ugajin

[11] Patent Number: 5,430,309
[45] Date of Patent: Jul. 4, 1995

[54] DATA PROCESSING SYSTEM FORMED OF A COLLECTIVE ELEMENT OF QUANTUM BOXES AND METHOD OF OPERATION THEREOF

[75] Inventor: Ryuichi Ugajin, Kanagawa, Japan

[73] Assignee: Sony Corporation, Tokyo, Japan

[21] Appl. No.: 172,734

[22] Filed: Dec. 27, 1993

[30] Foreign Application Priority Data

Dec. 28, 1992 [JP] Japan .................................. 4-360263

[51] Int. Cl.⁶ .................... H01L 27/12; G11C 7/00; H01S 3/18; H01S 3/19
[52] U.S. Cl. .................................. 257/14; 257/15; 257/432; 257/184; 365/215; 372/43; 372/45; 372/50
[58] Field of Search ............... 257/14, 15, 20, 21, 257/184, 432; 365/215; 372/45, 43, 50

[56] References Cited

U.S. PATENT DOCUMENTS

| | | | |
|---|---|---|---|
| 4,503,447 | 3/1985 | Iafrate et al. | 257/15 |
| 4,883,769 | 11/1989 | Au Coin et al. | 257/14 |
| 5,079,186 | 1/1992 | Narusawa | 437/133 |
| 5,182,788 | 1/1993 | Tanaka | 257/14 |
| 5,289,018 | 2/1994 | Okuda et al. | 372/50 |

*Primary Examiner*—Mahshid D. Saadat
*Attorney, Agent, or Firm*—Hill, Steadman & Simpson

[57] ABSTRACT

A data processing system formed of a collective element of quantum boxes including an electrode and a plurality of quantum boxes which respectively have a barrier layer made of the first semiconductor on the electrode and a well layer made of a second semiconductor adjacent to the barrier layer. The first semiconductor has an electron affinity $\Phi_B$ and an energy gap $E_{gB}$. The second semiconductor has an electron affinity $\phi_W$ and an energy gap $E_{gW}$. The equations $\phi_W > \phi_B$ and $\phi_W + E_{gW} > \phi_B + E_{gB}$ are simultaneously satisfied.

6 Claims, 6 Drawing Sheets

DATA PROCESSING SYSTEM FORMED OF A COLLECTIVE ELEMENT OF QUANTUM BOXES AND METHOD OF OPERATION THEREOF

RELATED APPLICATION

The present case is related to application, Ser. No. 229,303, filed Apr. 18, 1994, inventor Kazumasa Nomoto.

BACKGROUND

1. Field of the Invention

The present invention relates to a collective element of quantum boxes.

2. Background of the Invention

Recently, in the field of quantum wave electronics, attention has been paid to the so-called quantum box which has an extremely small structure with a cross sectional dimension being approximately the same as a de Broglie wavelength of an electron. People have been very interested in the quantum effect which is shown by a zero dimensional electron kept in this quantum box.

The collective element of quantum boxes is made of a plurality of these quantum boxes combined with each other. The element is intended to perform data processing with a varying distribution of electrons by causing a tunneling (in the meaning of quantum mechanics) of an electron ($e^-$) between the quantum boxes, as shown in FIG. 10. In the drawing, $E_{CB}$ and $E_{CW}$ respectively show the energies at lower ends of conduction bands for a barrier layer and a well layer.

The following steps have been considered to perform the data processing. First, by providing an incident ray into the collective element of the quantum boxes, the data entry is performed. An electron and hole pair are generated by the incident ray. The tunneling is caused only for the electron.

However, when the quantum box is made of the superlattice of so-called type I such as the hetero junction of AlGaAs/GaAs as shown in FIG. 11, for example, an electron and hole pair generated in the quantum box by the incident ray could be more stabilized in the quantum box, rather than in the barrier layer. Therefore, the probability becomes large for both the electron and the hole to stay in the quantum box and re-couple to each other and then disappear. It becomes very difficult for only the electron to be tunneled and conducted between the quantum boxes.

SUMMARY OF THE INVENTION

It is, therefore, an object of the present invention to provide a collective element of quantum boxes useful as a data processing system which enables only the electron to be conducted between the quantum boxes when both an electron and a hole are generated in the quantum box upon entry of an incident ray.

In one aspect of the present invention, a collective element of quantum boxes includes an electrode and a plurality of quantum boxes which respectively have a barrier layer made of a first semiconductor on the electrode and a well layer made of a second semiconductor adjacent to the barrier layer. The first semiconductor has an electron affinity $\phi_B$ and an energy gap $E_{gB}$. The second semiconductor has electron affinity $\phi_W$ and an energy gap $E_{gW}$ where the equations $\phi_W > \phi_B$ and $\phi_W + E_{gW} > \phi_B + E_{gB}$ are simultaneously satisfied.

In accordance with the present invention, an electron and a hole are both generated by the entry of an incident ray in the quantum box. By pulling the hole into an electrode, only the electron is left in the quantum box. The data processing can be performed by causing a tunneling (in the meaning of quantum mechanics) of an electron between the quantum boxes, and therefore a varying of the distribution of electrons.

DESCRIPTION OF THE INVENTION

Figure 1:
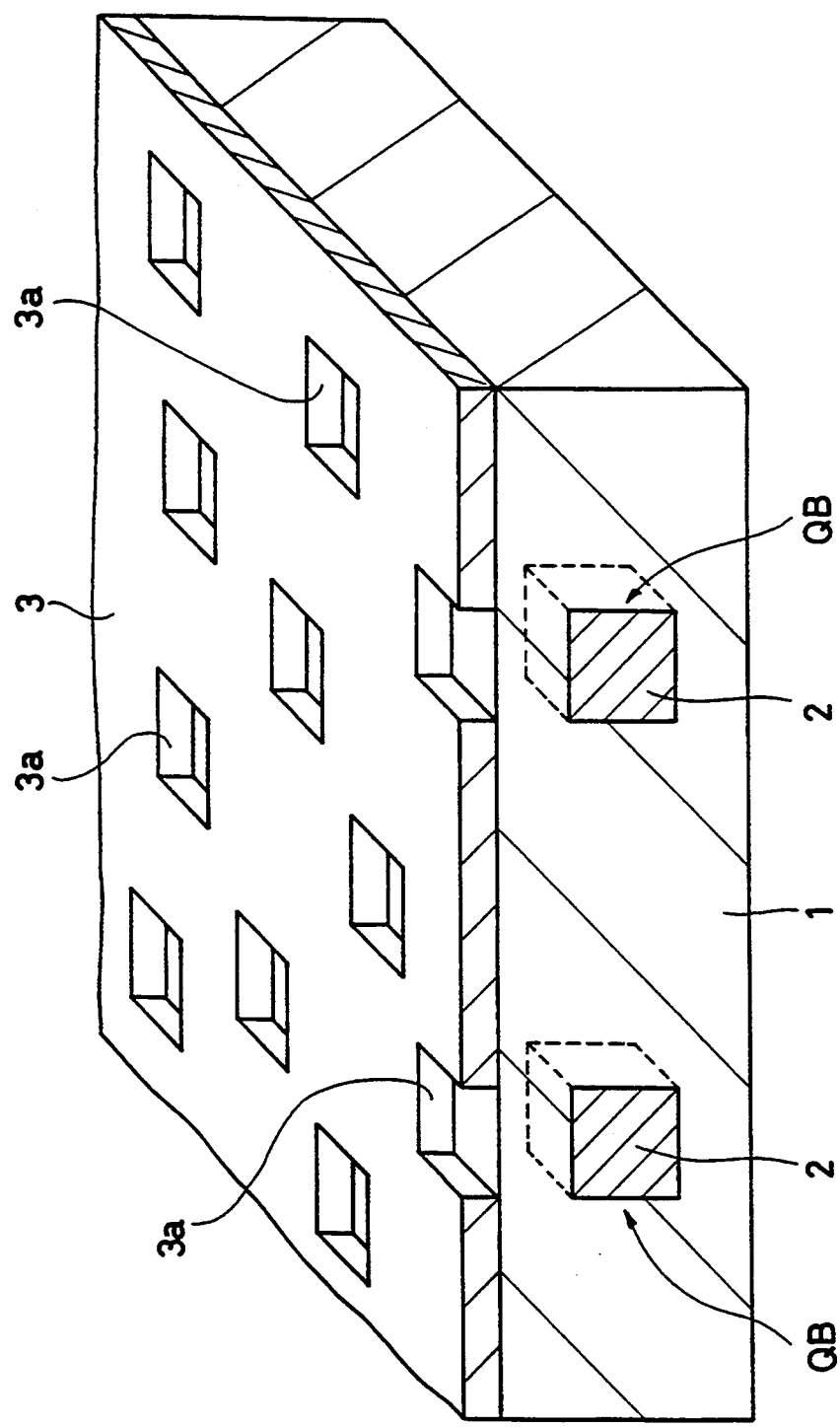
FIG. 1 shows a perspective view of a collective element of quantum boxes as an embodiment of the invention.
Figure 2:
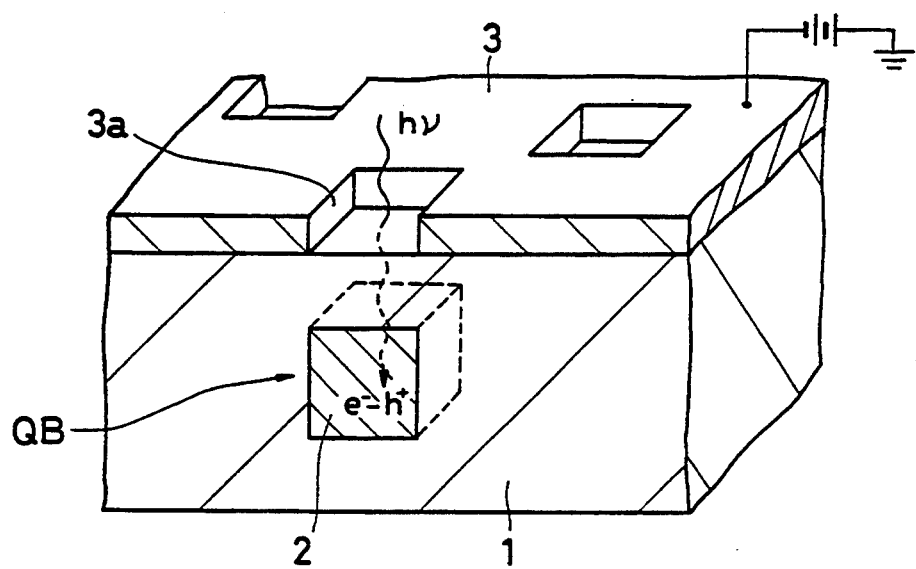
FIGS. 2 to 4 show perspective views explaining operation of the collective element of quantum boxes as an embodiment of the invention.
Figure 3:
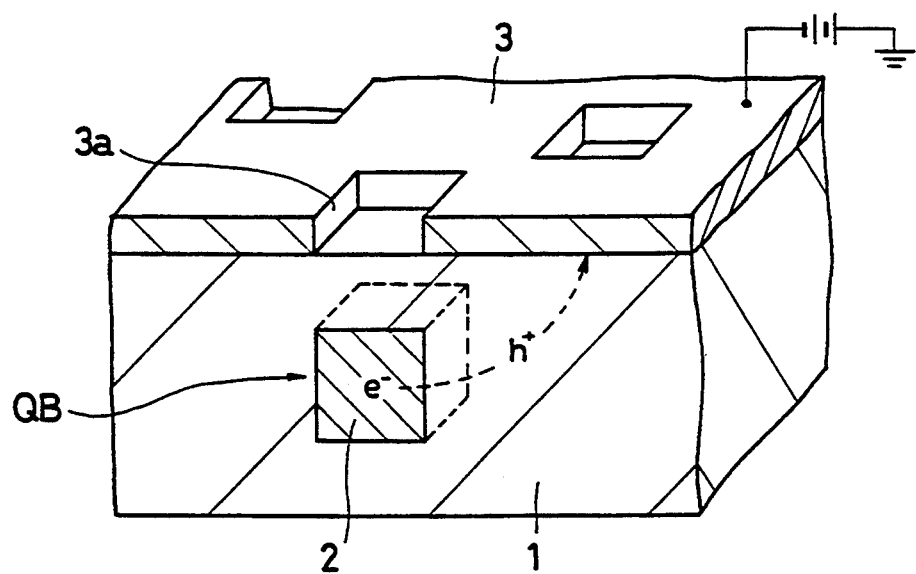

Referring to FIG. 1, a collective element of quantum boxes of the invention will be explained. A GaSb layer 1 and a InAs layer 2 are disposed as shown in FIG. 1. A plurality of quantum boxes QB are arranged in a desired pattern having the GaSb layer 1 as a barrier layer and the InAs layer 2 as a well layer. In this example, the InAs layer 2 as a well layer is completely surrounded by the GaSb layer 1. Since the well layer 2 is surrounded by the barrier layer 1, it is not exposed to atmosphere. Therefore, any materials which are easy to oxidize can be utilized as the materials for the well layer 2. A deterioration of the quantum box QB based on the change in quality of the well layer 2 can be avoided. The hetero junction superlattice of GaSb/InAs to compose the quantum box is a superlattice of type III. An electrode 3 made of a metal is formed on the GaSb layer 1 as a barrier layer. Corresponding to the locations of the quantum boxes, a plurality of openings 3a are formed in the electrode 3. It is apparent that the incident ray can be irradiated to the desired quantum box QB through these openings 3a, even though non-transparent materials such as metal are utilized as the materials for electrode 3. Next, the operational theory of the collective element of quantum boxes of this embodiment will be explained. As shown in FIG. 2, a negative bias voltage is applied to the electrode 3 when entering data. An incident ray is irradiated to a quantum box QB through a selected one of the openings 3a in the electrode 3, which is corresponding to the quantum box QB. An electron ($e^-$) and hole ($h^+$) pair are generated in the quantum box QB. At this time, compared with the hole of the electron and hole pair, it has lower energy when it is located outside of the quantum box QB. In addition, the negative bias voltage is applied to the electrode 3. Therefore, as shown in FIG. 3, the hole is pulled and absorbed toward the electrode 3. As a result, only the electron is left in the quantum box QB. The data processing can be performed by causing a tunneling (in the meaning of quantum mechanics) of an electron between the quantum boxes, and therefore a varying of the distribution of electrons.

Figure 4:
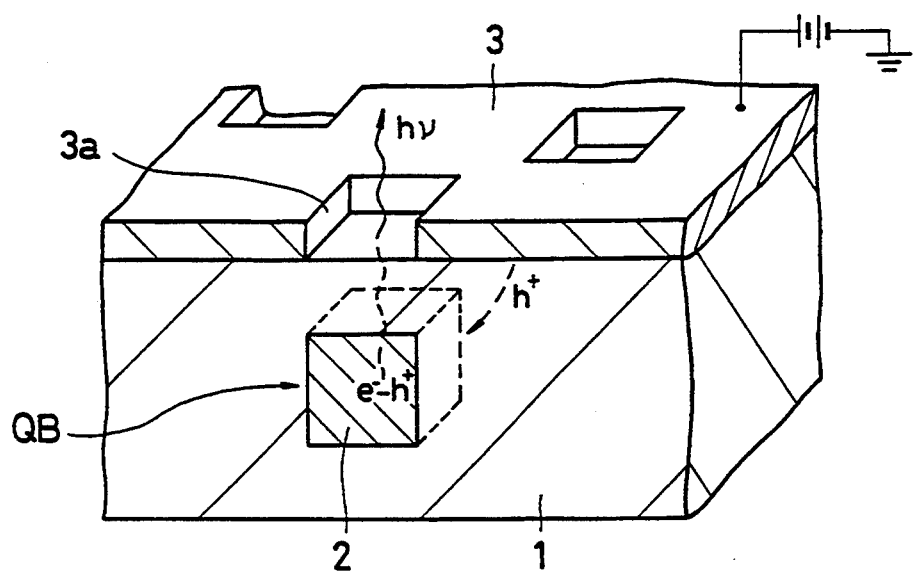

A positive bias voltage is applied to the electrode 3 when retrieving data, as shown in FIG. 4. Then a hole is poured from the electrode 3 into the adjacent GaSb layer 1 as a barrier layer. The hole is re-coupled with the electron in the quantum box QB. A light is generated at this time and it goes out of the opening 3a of electrode 3 and is detected there. By applying the above process to the respective quantum boxes, the electron distribution can be known in the collective element of quantum boxes.

As described above, in accordance with this embodiment, the incident ray is irradiated to the collective element of quantum boxes. For an electron (e−) and hole (h+) pair generated in the quantum box QB, only the hole is pulled and absorbed toward the electrode 3. Only the electron is left in the quantum box QB. By conducting this electron between the quantum boxes, the desired data processing can be performed.

Figure 5:
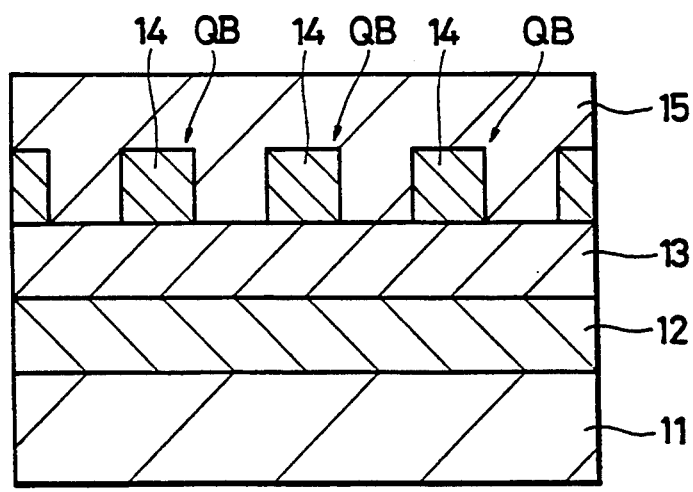
FIG. 5 shows a sectional view of a collective element of quantum boxes as another embodiment of the invention.

FIG. 5 shows another embodiment of the collective element of quantum boxes of this invention. As shown in the drawing, according to this embodiment, a InAs layer 12 and a GaSb layer 13 are stacked in sequence on a AlGaSb substrate 11, for example. An array of InAs layer 14 divided into a plurality of boxes is formed on this GaSb layer 13. A AlGaAs layer 15 is formed so as to surround the InAs layer 14.

In this another, the InAs layer 12 works as an electrode to absorb the hole. A barrier layer is constructed by the GaSb layer 13 and the AlGaAs layer 15. This GaSb layer 13 and this AlGaAs layer 15 surround the InAs layer as a well layer, so that the quantum boxes are formed as shown in FIG. 5. A AlGaSb layer can be used instead of the GaSb layer 13.

In this embodiment, the data entry is performed by the incident ray irradiated to the desired quantum boxes like the previously explained embodiment. For an electron (e−) and a hole (h+) pair generated in the quantum box QB by the incident ray, only the hole is pulled and absorbed toward the InAs layer 12 as an electrode. Only the electron is left in the quantum box QB. Like the previously explained embodiment, a positive bias voltage is provide for the InAs layer 12 acting as an electrode when the data is retrieved. The hole supplied from the InAs layer 12 and the electron in the quantum box QB is, therefore, re-coupled again and the light generated by this re-coupling can be detected for the desired data processing.

Figure 6:
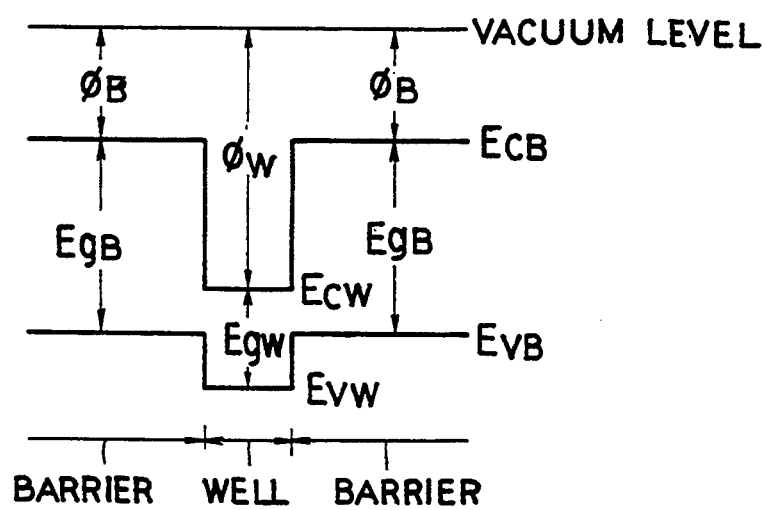
FIG. 6 shows the first typical energy band of the collective element of quantum boxes of the invention.
Figure 7:
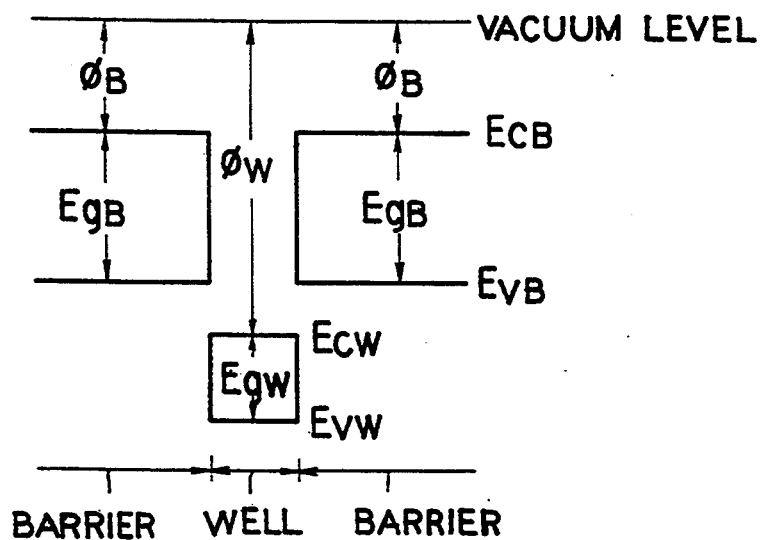
FIG. 7 shows the second typical energy band of the collective element of quantum boxes of the invention.

FIGS. 6 and 7 show the typical energy bands of the collective element of quantum boxes of the invention. In these drawings, $E_{CB}$ and $E_{VB}$ respectively show the lowest end of the conduction band and the highest end of the valence electron band in the first semi-conductor comprising of the barrier layer 1. $E_{cw}$ and $E_{vw}$ respectively show the lowest end of the conduction band and the highest end of the valence electron band in the second semi-conductor comprised of the well layer 2. The superlattice is called superlattice of type II having an energy band structure as shown in FIG. 6, and the other superlattice is called superlattice of type III having an energy band structure as shown in FIG. 7.

Figure 8:
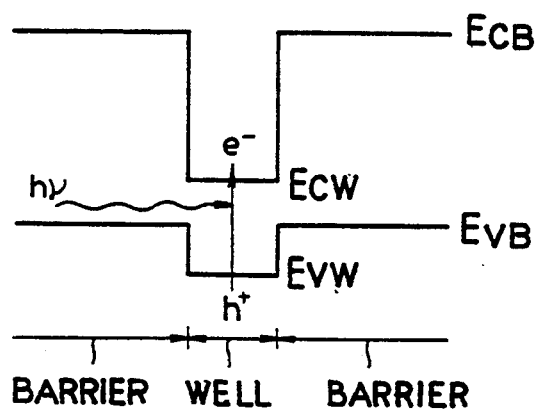
FIGS. 8 and 9 show energy bands explaining operations of the collective element of quantum boxes having a structure with the energy band shown in FIG. 6.

Now, as an example, it is considered that the incident ray is irradiated to the quantum box QB having the energy band structure shown in FIG. 6. An electron (e−) and a hole (h+) pair are generated in the quantum box QB as shown in FIG. 8. The hole of the generated hole and electron, pair has a higher potential when it is located in the second semiconductor functioning as the well layer 2. Considering the hole and electron pair as a whole, its energy becomes lower when the hole goes out of the quantum box QB. In other words, it becomes more stabilized when the hole goes out of the quantum box QB.

Figure 9:
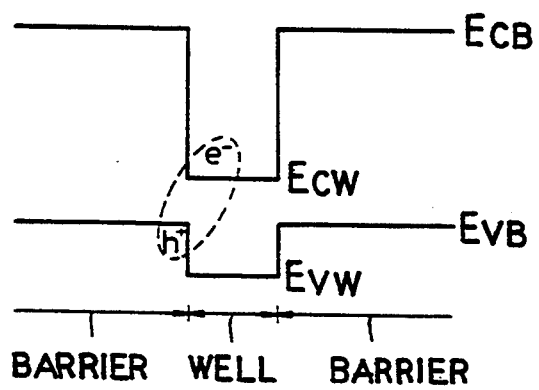
Figure 10:
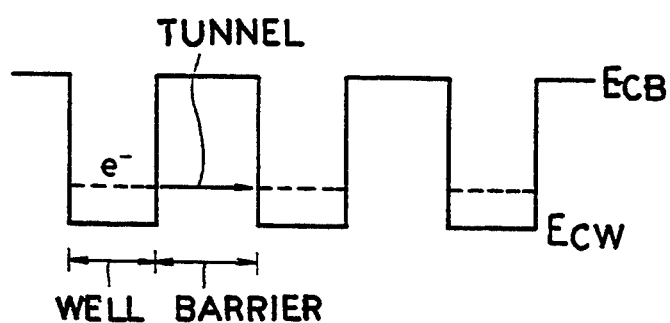
FIGS. 10 and 11 show energy bands for explaining a problem when a quantum box in a collective element is made of a superlattice of type I such as the hetero conjunction of AlGaAs/GaAs.
Figure 11:
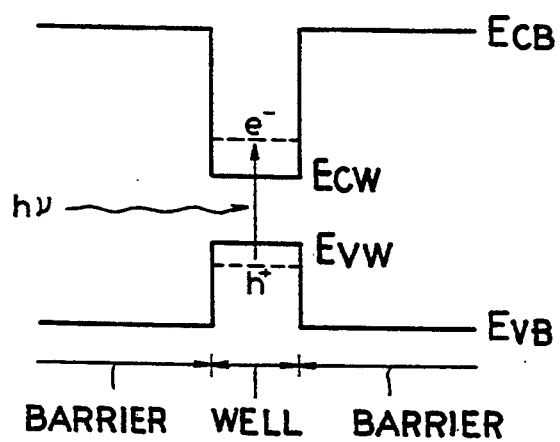

However, in practice, these hole and electron pairs are in their bound condition as shown in FIG. 9. There exists a probability of the re-coupling disappearing. To prevent this re-coupling, the hole should be retrieved. By providing the electrode 3 with an appropriate bias voltage, the hole can be absorbed into the electrode 3.

As explained above, for an electron (e−) and hole (h+) pair generated in the quantum box QB, only the hole is pulled and absorbed toward the electrode 3 by irradiating the incident ray. Only the electron is left in the quantum box QB. By conducting this electron between the quantum boxes, the distribution of electrons can be varied and, therefore, the desired data processing can be performed.

A similar effect can be expected by constructing the quantum box QB with the superlattice of type III having the energy band structure shown in FIG. 7.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

I claim:

1. A method of operating a collective element of quantum boxes such that only an electron is conducted between the quantum boxes when both an electron and a hole are generated in the quantum box upon entry of an incident ray, comprising the steps of:

providing a collective element of quantum boxes having a plurality of quantum boxes arranged in a barrier layer and wherein the quantum boxes comprise a well layer, providing an electrode overlying the quantum boxes and providing the electrode with windows therein corresponding to and aligned with each of the quantum boxes for permitting entry and exit of light to and from the quantum boxes, and providing a bias source for applying either a positive or negative bias voltage to the electrode;

applying a negative bias voltage to the electrode;

irradiating an incident ray to one of the quantum boxes through a selected one of the windows in the electrode corresponding to the quantum box to be irradiated, said incident ray generating an electron and a hole pair in the irradiated quantum box, the hole being pulled and absorbed toward the electrode having said negative bias applied thereto so that only the electron is left in the quantum box;

causing a tunnelling of the electron from the irradiated quantum box to another quantum box; and applying a positive bias voltage to the electrode so that a hole is poured from the electrode to at least one of the quantum boxes so that the hole is recoupled with an electron in the quantum box, and wherein a light is generated at this time and goes out of the window in the electrode corresponding to the quantum box where the hole is recoupled.

2. A method according to claim 1 including the step of providing a hetero-junction super lattice between the quantum box well layer and the barrier layer as GaSb-/InAs.

3. A method according to claim 1 including the step of providing the barrier layer of a first semiconductor and the well layer comprising the quantum boxes of a second semiconductor, the first semiconductor having electron affinity $\phi_B$ and energy gap $E_{gB}$ and said second semiconductor having electron affinity $\phi_W$ and energy gap $E_{gw}$ where equations $\phi_W > \phi_B$ and $\phi_W + E_{gW} > \phi_B + E_{gB}$ are simultaneously satisfied.

4. A method for data processing, comprising the steps of:
providing a collective element of quantum boxes having a plurality of quantum boxes arranged in a barrier layer and wherein the quantum boxes comprise a well layer, providing an electrode overlying the quantum boxes and providing the electrode with windows therein corresponding to and aligned with each of the quantum boxes for permitting entry and exit of light to and from the quantum boxes, and providing a bias source for applying either a positive or negative bias voltage to the electrode;
applying a negative bias voltage to the electrode;
irradiating an incident ray to one of the quantum boxes through a selected one of the windows in the electrode corresponding to the quantum box to be irradiated, said incident ray generating an electron and a hole pair in the irradiated quantum box, the hole being pulled and absorbed toward the electrode having said negative bias applied thereto so that only the electron is left in the quantum box;
causing a tunnelling of the electron from the irradiated quantum box to one of the other quantum boxes to represent a storing of data; and
to retrieve stored data, applying a positive bias voltage to the electrode so that a hole is poured from the electrode to at least one of the quantum boxes so that the hole is recoupled with an electron in the quantum box, and wherein a light is generated at this time and goes out of the window in the electrode corresponding to the quantum box where the hole is recoupled, and detecting said generated light to indicate data storage.

5. A method according to claim 4 including the step of providing a hetero-junction super lattice between the quantum box well layer and the barrier layer as GaSb-/InAs.

6. A method according to claim 4 including the step of providing the barrier layer of a first semiconductor and the well layer comprising the quantum boxes of a second semiconductor, the first semiconductor having electron affinity $\phi_B$ and energy gap $E_{gB}$ and said second semiconductor having electron affinity $\phi_W$ and energy gap $E_{gw}$ where equations $\phi_W > \phi_B$ and $\phi_W + E_{gW} > \phi_B + E_{gB}$ are simultaneously satisfied.

* * * * *